United States Patent
Peng et al.

(10) Patent No.: US 9,166,016 B1
(45) Date of Patent: Oct. 20, 2015

(54) SEMICONDUCTOR DEVICE AND METHOD FOR FABRICATING THE SAME

(71) Applicant: MACRONIX International Co., Ltd., Hsinchu (TW)

(72) Inventors: Chi-Sheng Peng, Hsinchu (TW); Chia-Wen Cheng, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 0 days.

(21) Appl. No.: 14/272,133

(22) Filed: May 7, 2014

(51) Int. Cl.
| | |
|---|---|
| *H01L 29/78* | (2006.01) |
| *H01L 29/49* | (2006.01) |
| *H01L 29/423* | (2006.01) |
| *H01L 21/3205* | (2006.01) |
| *H01L 21/285* | (2006.01) |
| *H01L 21/311* | (2006.01) |
| *H01L 21/321* | (2006.01) |
| *H01L 29/51* | (2006.01) |
| *H01L 29/66* | (2006.01) |

(52) U.S. Cl.
CPC ...... *H01L 29/4933* (2013.01); *H01L 21/28518* (2013.01); *H01L 21/31111* (2013.01); *H01L 21/3211* (2013.01); *H01L 21/32053* (2013.01); *H01L 21/32105* (2013.01); *H01L 29/42364* (2013.01); *H01L 29/51* (2013.01); *H01L 29/518* (2013.01); *H01L 29/665* (2013.01); *H01L 29/78* (2013.01)

(58) Field of Classification Search
CPC ........... H01L 21/76886; H01L 21/76889; H01L 21/823443; H01L 21/28518; H01L 29/665; H01L 29/42376; H01L 29/4933; H01L 29/42364
USPC ........... 257/412, 413, 211; 438/655, 664, 682
See application file for complete search history.

(56) References Cited

U.S. PATENT DOCUMENTS

| | | | |
|---|---|---|---|
| 6,455,383 B1 * | 9/2002 | Wu | 438/296 |
| 2002/0175381 A1 * | 11/2002 | Choi et al. | 257/369 |
| 2007/0087542 A1 * | 4/2007 | Huang et al. | 438/592 |

* cited by examiner

*Primary Examiner* — Tu-Tu Ho
(74) *Attorney, Agent, or Firm* — J.C. Patents

(57) ABSTRACT

Provided is a method for fabricating a semiconductor device including the following steps. A silicon-containing conductive layer is formed on a substrate. Then, a dielectric layer is formed around the silicon-containing conductive layer. A portion of the dielectric layer is removed to expose a first sidewall of the silicon-containing conductive layer. A shielding structure is formed on a partial surface of the silicon-containing conductive layer, and the shielding structure exposes at least the first sidewall. A metal layer is formed on the substrate to cover the silicon-containing conductive layer not covered by the shielding structure. A salicide process is performed to form a silicide layer.

6 Claims, 7 Drawing Sheets

SEMICONDUCTOR DEVICE AND METHOD FOR FABRICATING THE SAME

BACKGROUND OF THE INVENTION

1. Field of the Invention

The invention relates to an electronic device and a method for fabricating the same, and more particularly, to a semiconductor device and a method for fabricating the same.

2. Description of Related Art

A silicide layer has the advantages of, for instance, high melting point, high stability, and low resistance, and is currently widely applied to integrated circuits. Due to the gradual miniaturization of integrated circuit techniques, the linewidth, the contact area, and the junction depth . . . etc. are gradually becoming smaller. To effectively increase the performance quality of the devices, lower resistance, and reduce signal transmission delay caused by resistance and capacitance, a polycide gate is often used to replace the known polysilicon gate such that a silicide layer can be used to effectively reduce junction resistance.

The current salicide process includes covering a metal layer on the surface and the sidewall of a patterned polysilicon such that the salicide process can be performed from three sides at the same time. However, the silicide layer formed by the method often generates necking or line bending on the contour. Therefore, the phenomenon of peeling or fracture readily occurs to the silicide layer. Moreover, although a uniform silicide layer can be formed by performing the salicide process on only the top surface, the thickness of the resulting silicide layer is too thin and is therefore unsatisfactory. The resistance of the silicide layers and the interface thereof formed by the two processes above is higher.

Moreover, when various semiconductor devices are integrated on the same chip, the silicide layers of the devices having various linewidths are also different from one another. For instance, in an integrated device having both a narrow linewidth and a wide linewidth, if a silicon-containing conductive layer having a narrow linewidth is completely silicidated, then poor silicide is generated for a silicon-containing conductive layer having a wide linewidth due to insufficient time of the salicide process. On the other hand, if the silicon-containing conductive layer having a wide linewidth is completely silicidated in a self-aligned manner, then necking or bending occurs to the silicon-containing conductive layer having a narrow linewidth due to over-silicidation, and the phenomenon of peeling or fracture may even occur. Therefore, how to completely silicidate silicon-containing conductive layers having different linewidths without causing necking or bending to the silicide layer or the generation of poor silicide is an issue that needs to be solved.

SUMMARY OF THE INVENTION

Accordingly, the invention provides a semiconductor device and a method for fabricating the same, wherein a silicide layer having a straighter contour with less bending can be fabricated.

The invention provides a semiconductor device and a method for fabricating the same, wherein silicide layers having different linewidth dimensions can be fabricated.

The invention provides a semiconductor device and a method for fabricating the same, wherein the narrow line width effect and the thickness uniformity of the silicide layer can be improved.

The invention provides a method for fabricating a semiconductor device including the following steps. A silicon-containing conductive layer is formed on a substrate. A dielectric layer is formed around the silicon-containing conductive layer. A portion of the dielectric layer is removed to expose a first sidewall of the silicon-containing conductive layer. A shielding structure is formed on a partial surface of the silicon-containing conductive layer, and the shielding structure exposes at least the first sidewall. A metal layer is formed on the substrate to cover the silicon-containing conductive layer not covered by the shielding structure. A salicide process is performed to form a silicide layer.

In an embodiment of the invention, the shielding structure includes a top shielding layer covering the top surface of the silicon-containing conductive layer to expose the first sidewall of the silicon-containing conductive layer.

In an embodiment of the invention, the method for forming the silicon-containing conductive layer and the shielding structure includes the following steps. A silicon-containing conductive material layer is formed on a substrate. A shielding material layer is formed on the silicon-containing conductive material layer. The shielding material layer and the silicon-containing conductive material layer are patterned to form the top shielding layer and the silicon-containing conductive layer.

In an embodiment of the invention, the shielding structure includes a shielding spacer covering a second sidewall of the silicon-containing conductive layer and exposing the first sidewall and the top surface of the silicon-containing conductive layer.

In an embodiment of the invention, the step for forming the silicon-containing conductive layer and the shielding spacer includes the following steps. A silicon-containing conductive material layer is formed on a substrate. A first patterning process is performed to remove a portion of the silicon-containing conductive material layer so as to form an upper portion of the silicon-containing conductive layer and expose the second sidewall. The shielding spacer is formed on the second sidewall of the silicon-containing conductive layer. A second patterning process is performed to remove another portion of the silicon-containing conductive material layer so as to form a lower portion of the silicon-containing conductive layer and expose the first sidewall and a third sidewall.

In an embodiment of the invention, the method for forming the shielding spacer includes the following steps. A shielding material layer is formed on a substrate to cover the top surface and a second sidewall of the upper portion of the silicon-containing conductive layer. Anisotropic etching is performed on the shielding material layer to expose the top surface of the upper portion of the silicon-containing conductive layer.

In an embodiment of the invention, the method for forming the shielding spacer includes the following steps. The dielectric layer exposes the top surface and the second sidewall of the silicon-containing conductive layer before a portion of the dielectric layer is removed. A surface treatment is performed on the top surface and the second sidewall of the silicon-containing conductive layer to form a protective layer. A portion of the protective layer is removed when a portion of the dielectric layer is removed to expose the top surface and the first sidewall of the silicon-containing conductive layer and form the shielding spacer on the second sidewall.

In an embodiment of the invention, the surface treatment includes a plasma treatment.

In an embodiment of the invention, the feed gas of the plasma treatment includes an oxygen-containing gas, a nitrogen-containing gas, or a combination thereof.

The invention provides a semiconductor device. The semiconductor device includes a silicon-containing conductive layer, a dielectric layer, a silicide layer, and a shielding structure. The dielectric layer is located around the silicon-containing conductive layer. The silicide layer is located on the silicon-containing conductive layer. The shielding structure covers a portion of the silicide layer.

In an embodiment of the invention, the shielding structure includes a top shielding layer covering the top surface of the silicide layer.

In an embodiment of the invention, the shielding structure includes a shielding spacer exposing the first sidewall and the top surface of the silicide layer and covering the second sidewall of the silicide layer.

In an embodiment of the invention, the width of the upper portion of the silicide layer is less than the width of the lower portion of the silicide layer.

In an embodiment of the invention, the material of the shielding structure includes silicon oxide, silicon nitride, or a combination thereof.

Based on the above, in the invention, a shielding structure is used to cover a partial surface of a silicon-containing conductive layer such that a silicide layer formed has the features of a straighter contour with less bending and a greater thickness. Therefore, the invention not only can prevent the generation of necking or line bending on the contour of a silicide layer, but a silicide layer having a lower resistance can also be obtained.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the invention, a shielding structure is used to cover a partial surface of a silicon-containing conductive layer such that a salicide process can be performed on only a single surface of the silicon-containing conductive layer at a corner and in contact with a metal layer. As a result, over-silicidation to the silicon-containing conductive layer at the corner is prevented such that the generation of necking or line bending on the contour of a silicide layer does not occur.

FIG. 1A to FIG. 1F are cross-sectional schematic diagrams of a fabrication process of a semiconductor device illustrated according to the first embodiment of the invention.

Figure 1A:
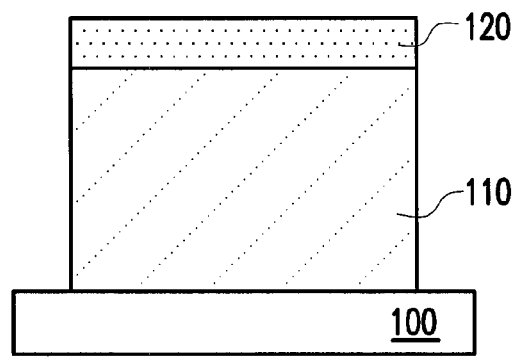
FIG. 1A to FIG. 1F are cross-sectional schematic diagrams of a fabrication process of a semiconductor device illustrated according to the first embodiment of the invention.

Referring to FIG. 1A, a substrate 100 is provided. The substrate 100 is, for instance, a semiconductor substrate, a semiconductor compound substrate, or a semiconductor on insulator (SOD). The semiconductor is, for instance, a Group IVA atom such as silicon or germanium. The semiconductor compound is, for instance, a semiconductor compound formed by a Group IVA atom, such as silicon carbide or silicon germanium, or a semiconductor compound formed by a Group IIIA atom and a Group VA atom, such as gallium arsenide.

Then, a silicon-containing conductive material layer 110 is formed on the substrate 100. The material of the silicon-containing conductive material layer 110 is, for instance, doped polysilicon, undoped polysilicon, or a combination thereof, and the method for forming the silicon-containing conductive material layer 110 includes, for instance, a chemical vapor deposition method. In an embodiment, the thickness of the silicon-containing conductive material layer 110 is 90 nm to 120 nm.

Then, a shielding material layer 120 is formed on the silicon-containing conductive material layer 110. The material of the shielding material layer 120 is, for instance, a dielectric material, or a metal material. The dielectric material is, for instance, SiO, SiN, SiON, SiC, or SiCN. The method for forming the dielectric material includes, for instance, a chemical vapor deposition method. The material of the shielding material layer 120 is not limited to the above. Any material resulting in a high etching selectivity between the shielding material layer 120 and the silicon-containing conductive material layer 110 is covered by the scope of the invention.

Figure 1B:
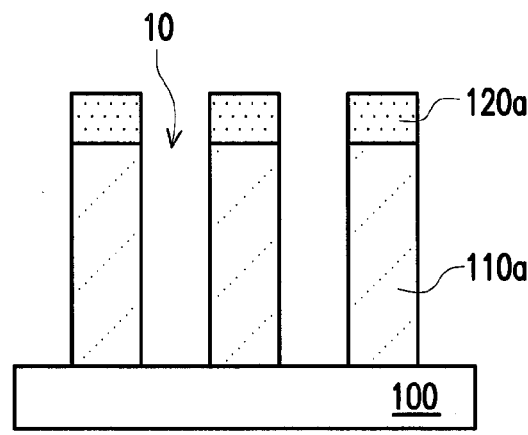

Referring to FIG. 1B, the shielding material layer 120 and the silicon-containing conductive material layer 110 are patterned to form a shielding structure 120a and a silicon-containing conductive layer 110a. In the present embodiment, the shielding structure 120a is, for instance, a top shielding layer covering the top surface of the silicon-containing conductive layer 110a. Specifically, an etching process is performed by using a patterned photoresist layer (not shown) as a mask to remove a portion of the shielding material layer 120 so as to form the shielding structure 120a. Then, using the shielding structure 120a as an etch mask, an etching process (such as a sputter etching method, a reactive ion etching method, or an ion beam etching method) is performed to remove the silicon-containing conductive material layer 110 so as to expose the substrate 100. The silicon-containing conductive layer 110a and a trench 10 are thus formed. The silicon-containing conductive layer 110a is, for instance, a control gate. The shielding structure 120a covers the top surface of the silicon-containing conductive layer 110a. As a result, the top surface of the silicon-containing conductive layer 110a does not come in contact with a metal layer 140 (FIG. 1E) formed thereafter, and a salicide process (FIG. 1F) is not performed from the top surface of the silicon-containing conductive layer 110a.

Figure 1C:
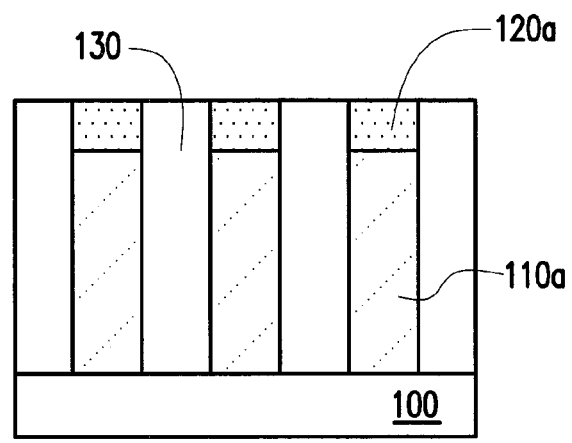

Referring to FIG. 1C, a dielectric layer 130 is formed around the silicon-containing conductive layer 110a. The method for forming the dielectric layer 130 includes, for instance, the following steps. A dielectric material layer (not shown) is formed on the shielding structure 120a, and completely fills the trench 10. The material of the dielectric material layer is, for instance, an oxide. The oxide is, for instance, a spin-on glass (SOG), a high-density plasma oxide (HDP oxide), or an undoped silicate glass (USG), and the method for forming the oxide can include a chemical vapor deposition method or a spin coating method. Then, using the shielding structure 120a as a stop layer, the dielectric material layer is removed with chemical mechanical polishing (CMP) to expose the top surface of the shielding structure 120a.

Figure 1D:
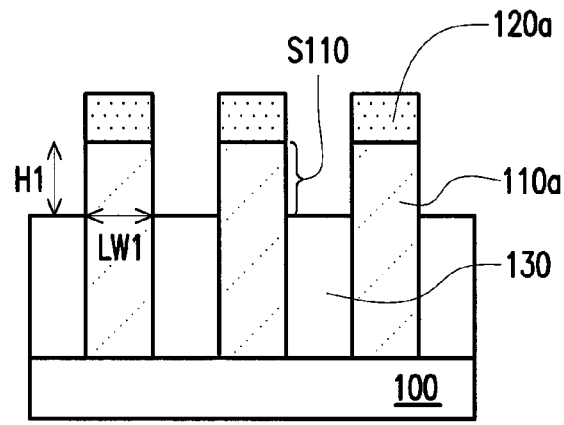

Referring to FIG. 1D, an etching-back process is performed to remove a portion of the dielectric layer 130 and expose a first sidewall S110 of the silicon-containing conductive layer 110a. The etching-back process is, for instance, a dry etching process or a wet etching process. In an embodiment, the ratio of a height H1 of the first sidewall S110 of the silicon-containing conductive layer 110a and a linewidth LW1 of the silicon-containing conductive layer 110a can be 0.5 to 1 (H1/LW1). The ratio of the height H1 and the linewidth LW1 of the silicon-containing conductive layer 110a can be adjusted through the process conditions such that over-silicidation does not occur to the silicon-containing conductive layer 110a. As a result, the generation of necking or line bending can be prevented.

Figure 1E:
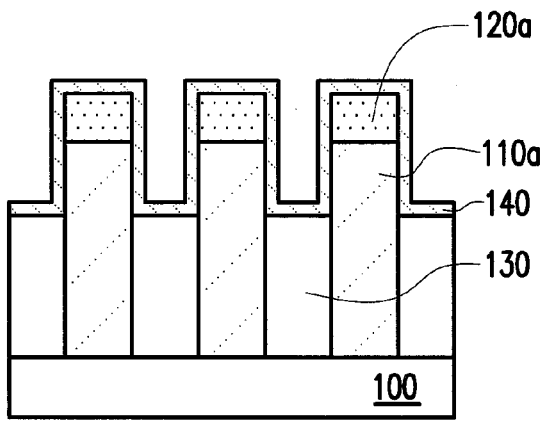

Referring to FIG. 1E, the metal layer 140 is formed on the substrate 100 to contact the silicon-containing conductive layer 110a not covered by the shielding structure 120a. Specifically, the metal layer 140 is conformally formed along the top surface of the dielectric layer 130, the first sidewall S110 of the silicon-containing conductive layer 110a, and the sidewall and the top surface of the shielding structure 120a. The material of the metal layer 140 can be, for instance, a metal material such as Ni, Co, Ti, W, Mo, Pt, or Pd. The material of the metal layer 140 is not limited thereto. Any material allowing the metal layer 140 and the silicon-containing conductive material to form a silicide material is covered by the scope of the invention.

Figure 1F:
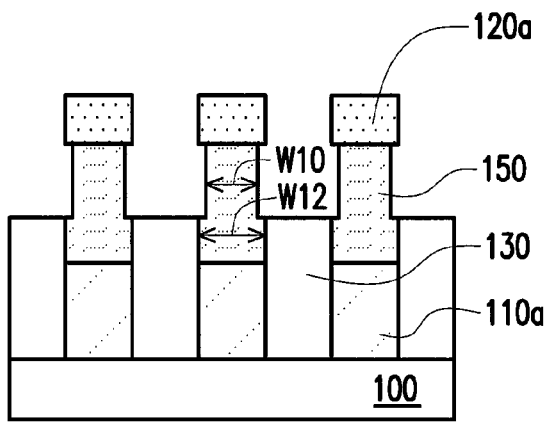

Referring to FIG. 1F, a salicide process is performed such that the metal layer 140 and the silicon-containing conductive layer 110a (first sidewall S110) in contact with the metal layer 140 react to form the silicide layer 150. The salicide process is, for instance, an anneal process. The material of the silicide layer 150 is, for instance, a material such as NiSi, CoSi, TiSi, WSi, MoSi, PtSi, or PdSi. However, the material of the silicide layer 150 of the invention is not limited thereto. In an embodiment, by controlling the process conditions and the reaction time, the salicide process between the silicon-containing conductive layer 110a and the metal layer 140 can occur not only on the first sidewall S110, but can also be performed on a portion of the silicon-containing conductive layer 110a below the top surface of the dielectric layer 130. Therefore, the bottom portion of the silicide layer 150 formed may be level with or lower than the top surface of the dielectric layer 130, but the invention is not limited thereto.

Then, a selective etching process is performed to remove the unreacted metal layer 140 so as to expose the shielding structure 120a and the silicide layer 150. In an embodiment, the selective etching process can be, for instance, a dry etching process. Since a portion of the silicon-containing conductive layer 110a may be consumed when the salicide process is performed on the silicon-containing conductive layer 110a and the metal layer 140, the volume of the silicide layer 150 after the reaction may be less than the volume of the silicon-containing conductive layer 110a before the reaction. The shrinkage phenomenon of the silicide layer makes a width W10 of the upper portion of the silicide layer 150 to be possibly less than a width W12 of the lower portion of the silicide layer 150. In an embodiment, the ratio of the linewidth of the original silicon-containing conductive layer 110a and the linewidth of the silicide layer 150 formed can be 0.90 to 0.95 (W10/W12).

In the prior art, the salicide process is performed with a polysilicon exposed on three continuous surfaces, and the shrinkage phenomenon of the silicide layer formed is very significant, thereby causing the linewidth of the silicide layer to be narrow, even causing bending or peeling. In the first embodiment of the invention, since the shielding structure 120a covers the top surface of the silicon-containing conductive layer 110a, the top surface of the silicon-containing conductive layer 110a does not come in contact with the metal layer 140. As a result, the silicidation reaction is performed from two first sidewalls S110 of the silicon-containing conductive layer 110a and is not performed from the top surface of the silicon-containing conductive layer 110a. Since the contact area between the silicon-containing conductive layer 110a and the metal layer 140 of the invention is reduced, in comparison to the prior art, the silicon consumed is less. As a result, the shrinkage phenomenon of the silicide layer can be reduced, and the generation of necking or line bending on the contour of the silicide layer due to over-silicidation can be prevented. The phenomenon of peeling or fracture can also be prevented. In comparison to the prior art, the contour of the silicide layer 150 formed according to the fabrication method of the first embodiment of the invention is straighter and has less bending. Moreover, the corresponding resistance thereof is also lower than the resistance of the prior art.

Referring to FIG. 1F, the semiconductor device of the first embodiment of the invention includes the silicon-containing conductive layer 110a, the dielectric layer 130, the silicide layer 150, and the shielding structure 120a. The dielectric layer 130 is located around the silicon-containing conductive layer 110a. The silicide layer 150 is located on the silicon-containing conductive layer 110a. The shielding structure 120a covers a portion of the silicide layer 150. More specifically, the shielding structure 120a is a top shielding layer covering the top surface of the silicide layer 150.

FIG. 2A to FIG. 2F are cross-sectional schematic diagrams of a fabrication process of a semiconductor device illustrated according to the second embodiment of the invention.

Figure 2A:
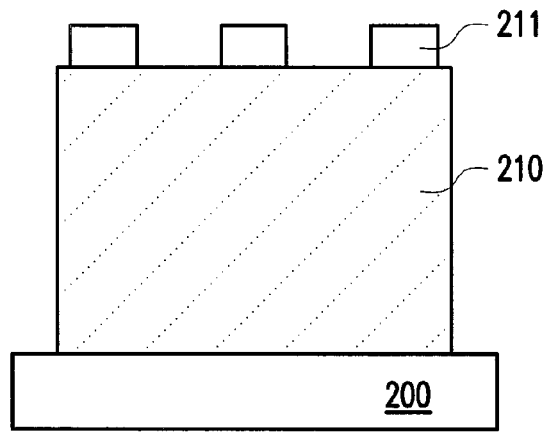
FIG. 2A to FIG. 2F are cross-sectional schematic diagrams of a fabrication process of a semiconductor device illustrated according to the second embodiment of the invention.

Referring to FIG. 2A, a substrate 200 is provided. The substrate 200 is, for instance, a semiconductor substrate, a semiconductor compound substrate, or an SOI. The semiconductor is, for instance, a Group IVA atom such as silicon or germanium. The semiconductor compound is, for instance, a semiconductor compound formed by a Group IVA atom, such as silicon carbide or silicon germanium, or a semiconductor compound formed by a Group IIIA atom and a Group VA atom, such as gallium arsenide.

Then, a silicon-containing conductive material layer 210 is formed on the substrate 200. The material of the silicon-containing conductive material layer 210 is, for instance, doped polysilicon, undoped polysilicon, or a combination thereof, and the method for forming the silicon-containing conductive material layer 210 includes, for instance, a chemical vapor deposition method. In an embodiment, the thickness of the silicon-containing conductive material layer 210 is 90 nm to 120 nm.

Figure 2B:
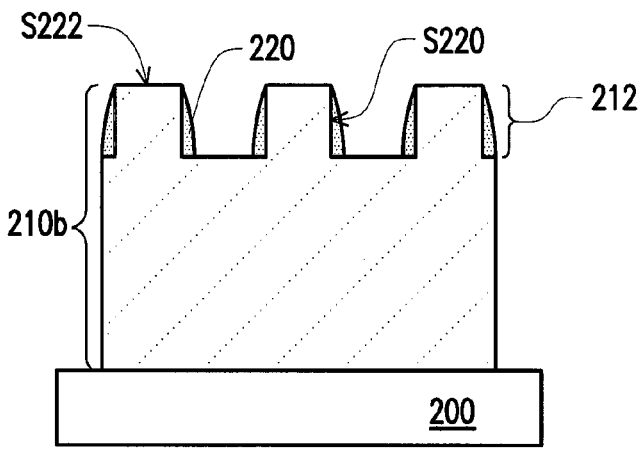
Figure 2C:
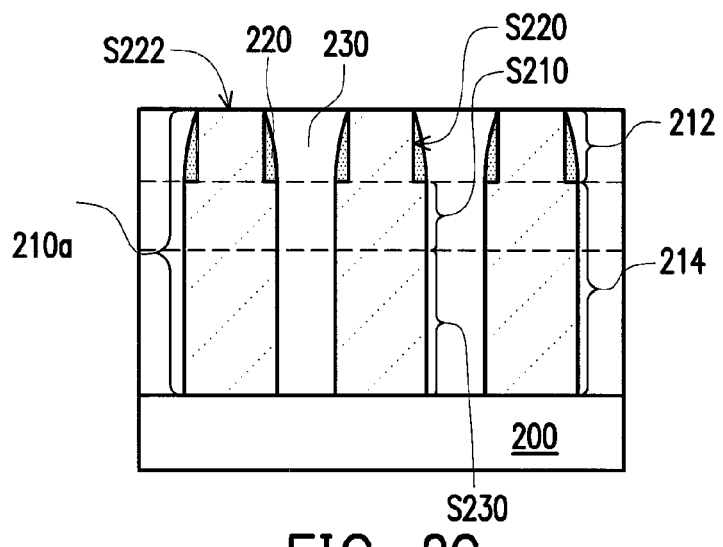

Referring to FIGS. 2A, 2B and 2C, the silicon-containing conductive material layer 210 is patterned to form a silicon-containing conductive layer 210a and form a shielding structure 220 on a second sidewall S220 of an upper portion 212 of the silicon-containing conductive layer 210a, thereby exposing a first sidewall S210 and a third sidewall S230 of a lower portion 214 of the silicon-containing conductive layer 210a. The silicon-containing conductive layer 210a is, for instance, a control gate. More specifically, referring to FIG. 2B, a pattern process is performed to remove a portion of the silicon-containing conductive material layer 210 so as to form a silicon-containing conductive layer 210b. The silicon-containing conductive layer 210b has the upper portion 212 (FIG. 2C) of the silicon-containing conductive layer 210a exposing the second sidewall S220 and a top portion S222. The method for removing the portion of the silicon-containing conductive material layer 210 includes, for instance, the following steps. A mask layer 211 (FIG. 2A) is formed on the silicon-containing conductive material layer 210. The mask layer 211 is, for instance, a patterned photoresist layer. Then, using the mask layer 211 as a mask, an etching process is performed on the silicon-containing conductive material layer 210 to form the upper portion 212 of the silicon-containing conductive layer 210b.

Then, the mask layer 211 is removed. The shielding structure 220 is formed on the second sidewall S220 of the silicon-containing conductive layer 210b. In the present embodiment, the shielding structure 220 is a shielding spacer covering the second sidewall S220 of the silicon-containing conductive layer 210a and exposing the top surface S222 of the silicon-containing conductive layer 210a. The method for forming the shielding structure 220 includes, for instance, the following steps. A shielding material layer (not shown) is formed on the substrate 200. In an embodiment, the material of the shielding material layer includes, for instance, SiO, SiN, SiON, SiC, or SiCN. The material of the shielding material layer is not limited thereto. Any material resulting in a high etching selectivity between the shielding material layer and the silicon-containing conductive layer 210 is covered by the scope of the invention. The method for forming the shielding material layer includes, for instance, a chemical vapor deposition method. Then, anisotropic etching is performed on the shielding material layer to expose the top surface S222 of the upper portion 212 of the silicon-containing conductive layer 210a and form the shielding structure 220 on the second sidewall S220 of the silicon-containing conductive layer 210a.

Referring to FIG. 2C, after the shielding structure 220 is formed, a dielectric layer 230 is formed around the silicon-containing conductive layer 210a. The method for forming the dielectric layer 230 includes, for instance, the following steps. A dielectric material layer (not shown) is formed on the shielding structure 220 and completely fills the trench in the silicon-containing conductive layer 210a. The material of the dielectric material layer is, for instance, an oxide. The oxide is, for instance, an SOG, an HDP oxide, or a USG, and the method for forming the oxide can include a chemical vapor deposition method or a spin coating method. Then, using the silicon-containing conductive layer 210a as a stop layer, the dielectric material layer is removed with CMP to expose the top surface S222 of the silicon-containing conductive layer 210a.

Figure 2D:
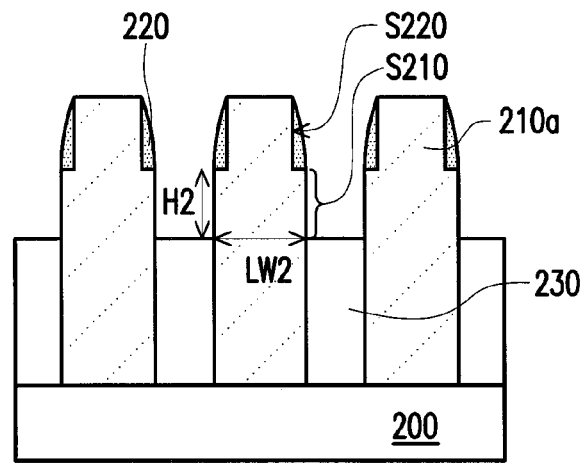

Then, referring to FIG. 2D, a portion of the dielectric layer 230 is removed with an etching-back process to expose the first sidewall S210 of the silicon-containing conductive layer 210a. The remaining dielectric layer 230 covers the third sidewall S230 of the silicon-containing conductive layer 210a. In an embodiment, the etching-back process can be, for instance, a dry etching process or a wet etching process. In an embodiment, the ratio of a height H2 of the first sidewall S210 of the silicon-containing conductive layer 210a and a linewidth LW2 of the silicon-containing conductive layer 210a can be 0.5 to 1 (H2/LW2). The ratio of the height H2 and the linewidth LW2 of the silicon-containing conductive layer 210a can be adjusted through the process conditions such that over-silicidation does not occur to the silicon-containing conductive layer 210a. As a result, the generation of necking or line bending can be prevented.

Figure 2E:
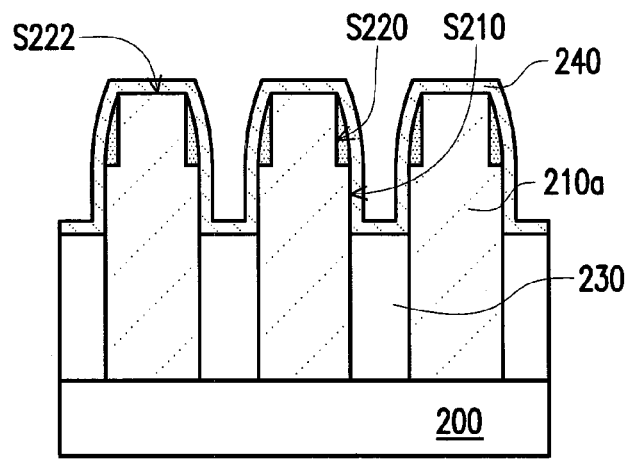
Figure 2F:
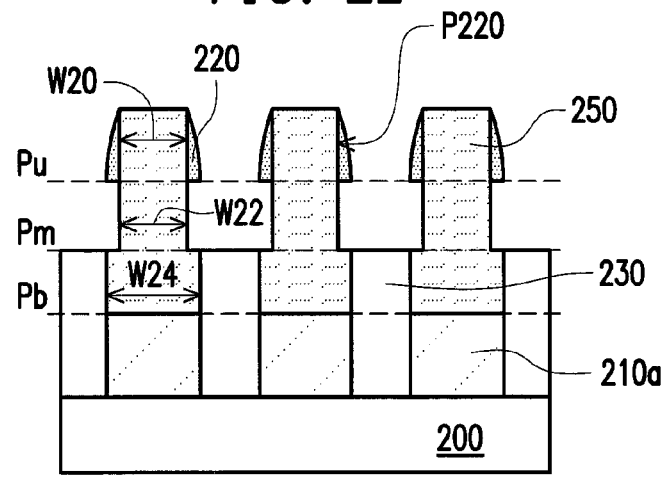

The steps of FIG. 2E and FIG. 2F are as described for FIG. 1E and FIG. 1F. Specifically, the metal layer 240 is formed on the substrate 200 to contact the silicon-containing conductive layer 210a not covered by the shielding structure 220. Then, a salicide process is performed to form a silicide layer 250. The material, the forming method, and the salicide process of the metal layer 240 are as described for the material, the forming method, and the salicide process of the metal layer 140 of the first embodiment, and are not repeated herein. FIG. 2E and FIG. 2F are different from FIG. 1E and FIG. 1F in that the shielding structure 220 of FIG. 2E covers the second sidewall S220 of the silicon-containing conductive layer 210a and exposes the top surface S222 of the upper portion 212 of the silicon-containing conductive layer 210a and the first sidewall S210 of the lower portion 214 of the silicon-containing conductive layer 210a. As a result, the salicide process can only be performed on the top surface S222 of the silicon-containing conductive layer 210a and the first sidewall S210 of the lower portion 214 of the silicon-containing conductive layer 210a. Since the second sidewall S220 between the top surface S222 and the first sidewall S210 of the silicon-containing conductive layer 210a is covered by the shielding structure 220, the salicide process is performed on the upper portion 212 of the silicon-containing conductive layer 210a through the top surface S222; and the salicide process is performed on the lower portion 214 of the silicon-containing conductive layer 210a through the first sidewall S210. In other words, since the shielding structure 220 covers the second sidewall S220, the salicide process can be performed from three discontinuous surfaces in different directions. As a result, the issue of over-silicidation between the metal layer 240 at the corner of the silicon-containing conductive layer 210a and the silicon-containing conductive layer 210a can be prevented.

Referring to FIG. 2F, the semiconductor device of the second embodiment of the invention includes the silicon-containing conductive layer 210a, the dielectric layer 230, the silicide layer 250, and the shielding structure 220. The dielectric layer 230 is located around the silicon-containing conductive layer 210a. The silicide layer 250 is located on the silicon-containing conductive layer 210a. The silicide layer 250 includes an upper portion Pu, a middle portion Pm, and a lower portion Pb. The lower portion Pb is located in the dielectric layer 230. A width W24 of the lower portion Pb is greater than a width W20 of the upper portion Pu and a width W22 of the middle portion Pm. In an embodiment, the ratio of the width W20 of the upper portion Pu and the width W22 of the middle portion Pm is 1 to 1.1 (W20/W22); and the ratio of the width W22 of the middle portion Pm and the width W24 of the lower portion Pb is 0.5 to 1 (W22/W24). The widths W20, W22, and W24 of the three portions may be different from one another, and are decided according to the process conditions and the reaction time. The shielding structure 220 covers a portion of the silicide layer 250. More specifically, the shielding structure 220 is a shielding spacer covering a sidewall P220 of the upper portion Pu of the silicide layer 250.

FIG. 3A to FIG. 3G are cross-sectional schematic diagrams of a fabrication process of a semiconductor device illustrated according to the third embodiment of the invention.

Figure 3A:
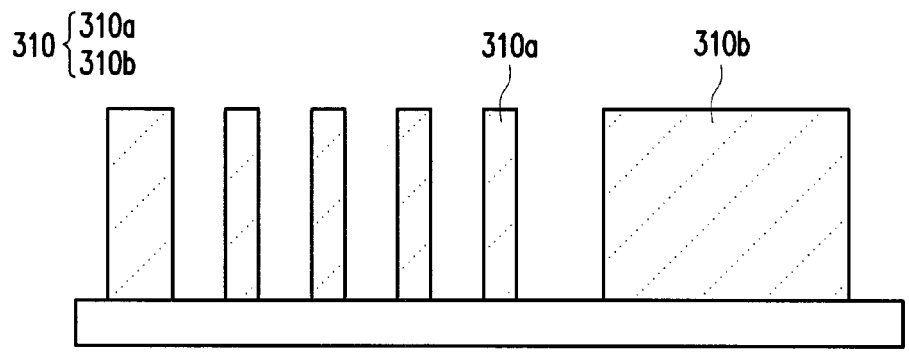
FIG. 3A to FIG. 3G are cross-sectional schematic diagrams of a fabrication process of a semiconductor device illustrated according to the third embodiment of the invention.

Referring to FIG. 3A, a silicon-containing conductive layer 310 is formed on a substrate 300. In an embodiment, the silicon-containing conductive layer 310 includes a silicon-containing conductive layer 310a (such as a word line) having a smaller linewidth and a silicon-containing conductive layer 310b (such as a peripheral circuit device) having a greater linewidth. The method of forming the silicon-containing conductive layer 310 includes, for instance, the following steps. A silicon-containing conductive material layer (not shown) is formed on the substrate 300. The material of the silicon-containing conductive material layer is, for instance, doped polysilicon, undoped polysilicon, or a combination thereof, and the method for forming the silicon-containing conductive material layer includes, for instance, a chemical vapor deposition method. In an embodiment, the thickness of the silicon-containing conductive material layer is 90 nm to 120 nm. Then, using the patterned mask layer (not shown) as a mask, an anisotropic etching process is performed to remove the silicon-containing conductive material layer so as to form the silicon-containing conductive layer 310.

Figure 3B:
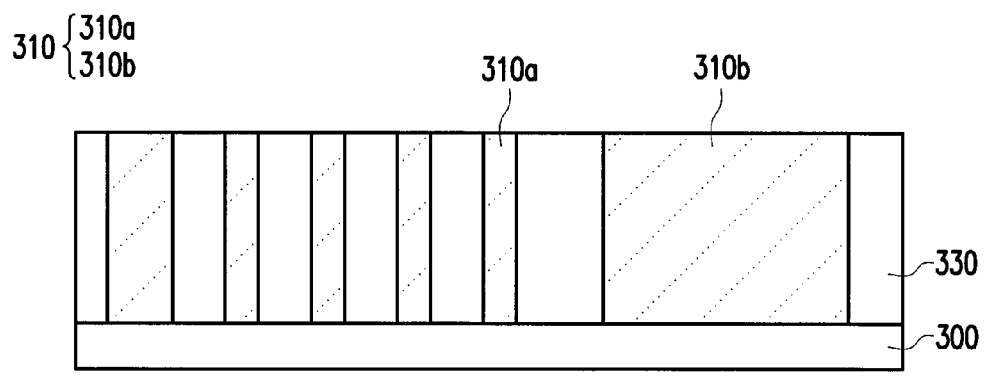

Referring to FIG. 3B, a dielectric layer 330 is formed around the silicon-containing conductive layer 310. The method for forming the dielectric layer 330 includes, for instance, the following steps. A dielectric material layer (not shown) is formed on the substrate 300. The material of the dielectric material layer is, for instance, an oxide. The oxide is, for instance, an SOG, an HDP oxide, or a USG, and the method for forming the oxide can include a chemical vapor deposition method or a spin coating method. Then, using the silicon-containing conductive layer 310 as a stop layer, the dielectric material layer is removed with CMP to expose the top surface of the silicon-containing conductive layer 310. The remaining dielectric material layer around the silicon-containing conductive layer 310 is the dielectric layer 330.

Figure 3C:
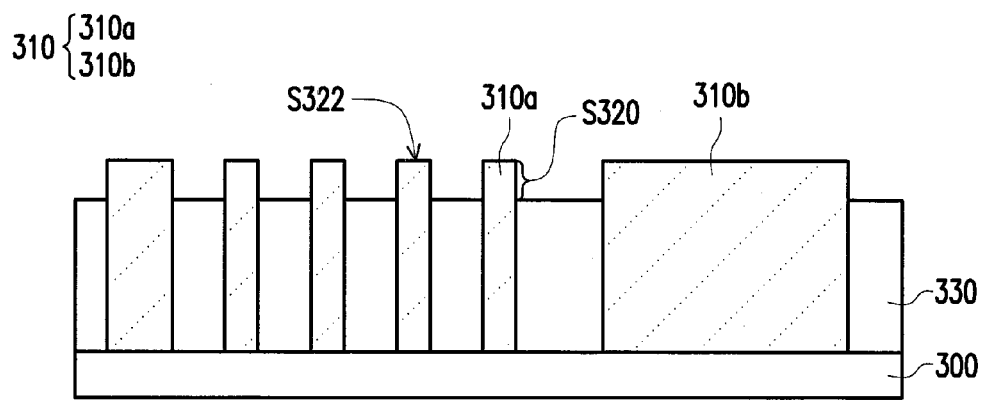

Referring to FIG. 3C, an etching-back process is used to remove a portion of the dielectric layer 330 so as to expose the top surface S322 and the second sidewall S320 of the silicon-containing conductive layer 310. In an embodiment, the height of the second sidewall S320 of the silicon-containing conductive layer 310 can be 15 nm to 35 nm. In an embodiment, the etching-back process can be, for instance, a dry etching process or a wet etching process.

Figure 3D:
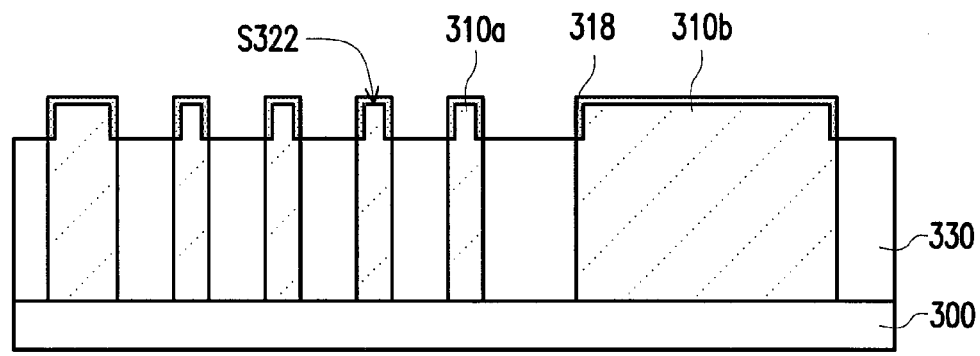

Referring to FIG. 3D, a protective layer 318 is formed on the top surface S322 and the second sidewall S320 of the silicon-containing conductive layer 310. The material of the protective layer 318 is, for instance, an oxide, a nitride, or a combination thereof. The material of the protective layer 318 of the invention is not limited thereto. Any material resulting in a high etching selectivity between the protective layer 318 and the silicon-containing conductive layer 310 is covered by the scope of the invention. The method for forming the protective layer 318 includes, for instance, a surface treatment. The surface treatment includes, for instance, a plasma treatment. The feed gas of the plasma treatment is, for instance, an oxygen-containing gas, a nitrogen-containing gas, or a combination thereof. Since the material of the silicon-containing conductive layer 310 and the material of the dielectric layer 330 are different, after the surface treatment, the protective layer 318 is selectively formed on the top surface S322 and the second sidewall S320 of the silicon-containing conductive layer 310 and does not form on the top surface of the dielectric layer 330. In an embodiment, the surface treatment is a plasma treatment, and when a nitrogen-containing gas is introduced, the nitrogen-containing gas reacts with the silicon on the surface of the silicon-containing conductive layer 310 to generate silicon nitride; and the nitrogen-containing gas does not react with the oxide on the surface of the dielectric layer 320. Therefore, the protective layer 318 is selectively formed on the top surface S322 and the second sidewall S320 of the silicon-containing conductive layer 310 and does not form on the top surface of the dielectric layer 330.

Figure 3E:
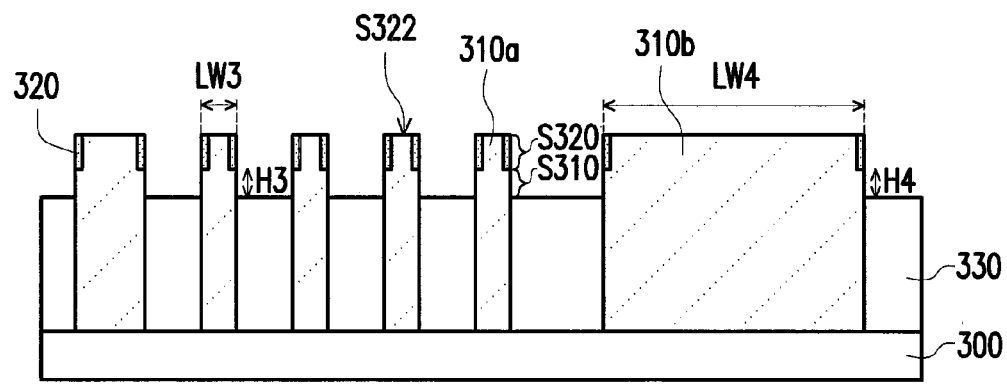

Referring to FIG. 3E, a portion of the dielectric layer 330 and a portion of the protective layer 318 are removed with an anisotropic etching process to form the shielding structure 320 and expose the top surface S322 and the first sidewall S310 of the silicon-containing conductive layer 310. In the present embodiment, the shielding structure 320 is a shielding spacer covering the second sidewall S320 of the silicon-containing conductive layer 310. The height of the second sidewall S320 is, for instance, 15 nm to 35 nm. In an embodiment, the etching-back process can be, for instance, a dry etching process or a wet etching process. In an embodiment, the silicon-containing conductive layer 310 includes the silicon-containing conductive layer 310*a* (such as a word line) having a smaller linewidth and the silicon-containing conductive layer 310*b* (such as a peripheral circuit device) having a greater linewidth. The ratio of a height H3 of the first sidewall S310 of the silicon-containing conductive layer 310*a* and a linewidth LW3 of the silicon-containing conductive layer 310*a* can be 0.5 to 1 (H3/LW3); and the ratio of a height H4 of the first sidewall S310 of the silicon-containing conductive layer 310*b* and a linewidth LW4 of the silicon-containing conductive layer 310*b* can be 0.025 to 0.05 (H4/LW4). The ratio of the height H3 and the linewidth LW3 thereof and the ratio of the height H4 and the linewidth LW4 of the silicon-containing conductive layer 310 can be adjusted through the process conditions such that over-silicidation due to an excessive contact area of the first sidewall S310 of the silicon-containing conductive layer 310*a* and the metal layer 340 formed thereafter does not occur to the silicon-containing conductive layer 310*a* having a narrow linewidth. As a result, the phenomenon of necking or line bending can be prevented. In contrast, the generation of poor silicide due to insufficient time of the salicide process also does not occur to the silicon-containing conductive layer 310*b* having a wide linewidth.

Figure 3F:
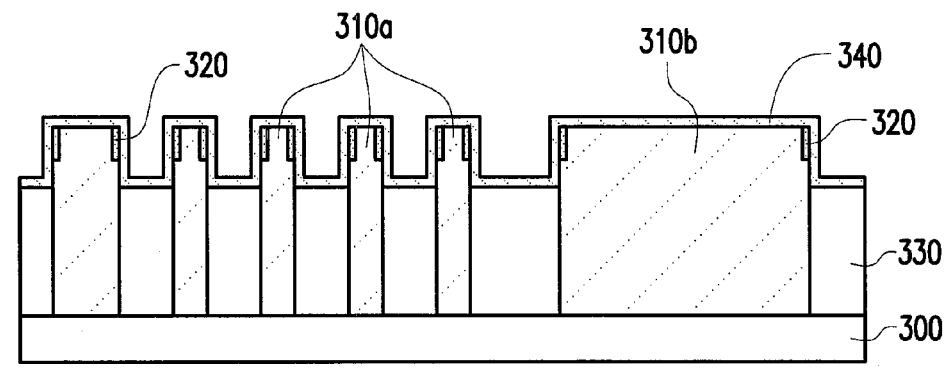
Figure 3G:
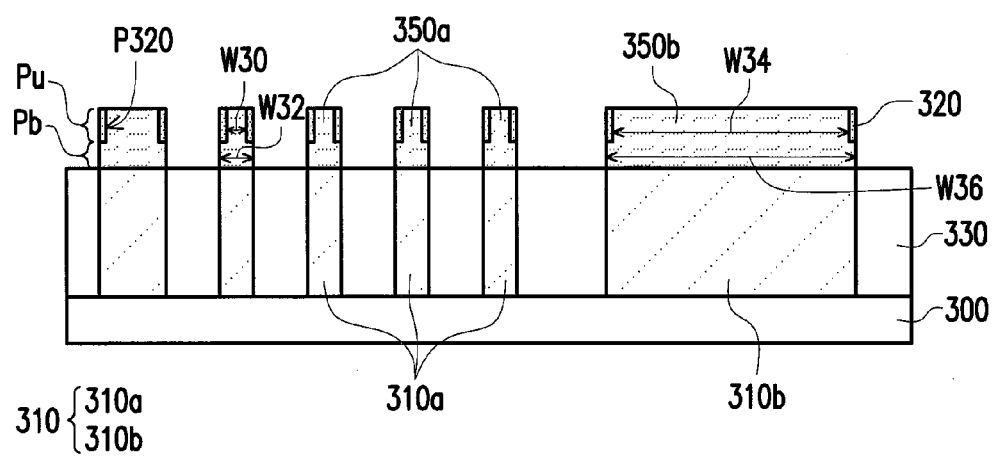

Referring to FIG. 3F and FIG. 3G, the metal layer 340 is formed on the substrate 300 to contact the silicon-containing conductive layer 310 not covered by the shielding structure 320. Then, a salicide process is performed to form a silicide layer 350. The material, the forming method, and the salicide process of the metal layer 340 are as described for the material, the forming method, and the salicide process of the metal layer 140 of the first embodiment, and are not repeated herein. After the salicide process is performed, the silicide layer 350 formed includes a silicide layer 350*a* having a smaller linewidth and a silicide layer 350*b* having a greater linewidth. In particular, the ratio of a width W30 of the upper portion and a width W32 of the lower portion of the silicide layer 350*a* having a smaller linewidth is, for instance, 0.8 to 0.9 (W30/W32); and the ratio of a width W34 of the upper portion and a width W36 of the lower portion of the silicide layer 350*b* having a greater linewidth is, for instance, 0.9 to 0.95 (W34/W36). The ratios of the two silicide layers are different and are decided according to the process conditions and the reaction time. However, the invention is not limited thereto. Moreover, if the time of the salicide process is increased, then the silicon-containing conductive layer 310 located in the dielectric layer 330 also reacts such that the silicide layer 350 formed is extended downward into the dielectric layer 330.

Referring to FIG. 3G, the semiconductor device of the third embodiment of the invention includes the silicon-containing conductive layer 310, the dielectric layer 330, the silicide layer 350, and the shielding structure 320. The dielectric layer 330 is located around the silicon-containing conductive layer 310. The silicide layer 350 is located on the silicon-containing conductive layer 310. The silicide layer 350 includes the upper portion Pu and the lower portion Pb. The width W32 of the lower portion Pb is greater than the width W30 of the upper portion Pu. In an embodiment, the ratio of the width W30 of the upper portion and the width W32 of the lower portion of the silicide layer 350*a* having a smaller linewidth is, for instance, 0.8 to 0.9 (W30/W32); and the ratio of the width W34 of the upper portion and the width W36 of the lower portion of the silicide layer 350*b* having a greater linewidth is, for instance, 0.9 to 0.95 (W34/W36). The ratios of the two silicide layers are different from each other, and are decided according to the process conditions and the reaction time. The shielding structure 320 covers a portion of the silicide layer 350. More specifically, the shielding structure 320 is a shielding spacer covering a sidewall P320 of the upper portion Pu of the silicide layer 350.

Based on the above, in the invention, a shielding structure covers a partial surface of a silicon-containing conductive layer at a corner such that a salicide process can be performed on only a single surface (top surface or sidewall) of the silicon-containing conductive layer at the corner and in contact with a metal layer. As a result, silicidation does not occur from two directions (top surface and sidewall) of the silicon-containing conductive layer at the corner at the same time, and therefore the generation of necking or line bending on the contour of the silicide layer is prevented. In the first embodiment, the shielding structure covers the top surface of the silicon-containing conductive layer such that a salicide process can only be performed from the sidewall of the silicon-containing conductive layer at the corner and not from the top surface. In the second and third embodiments, the shielding structure is a shielding spacer covering the silicon-containing conductive layer and the sidewall connected to the top surface thereof such that the salicide process can be performed from a plurality of discontinuous contact surfaces of the silicon-containing conductive layer. More specifically, in the second and third embodiments, the salicide process can be performed from the top surface of the silicon-containing conductive layer at the corner, and can also be performed from the sidewall of the silicon-containing conductive layer below the shielding structure. Moreover, in the invention, the shielding structure can also be used to completely silicidate silicon-containing conductive layers having different linewidths such that the issues of necking and bending of a silicide layer having a narrow linewidth and poor silicidation of a silicide layer having a wide linewidth do not occur. Therefore, a straighter silicide layer with less bending and a greater thickness can be fabricated according to the fabrication method of the invention. As a result, a silicide layer having lower resistance can also be obtained.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a silicon-containing conductive layer;
   a dielectric layer located around the silicon-containing conductive layer;
   a silicide layer located on the silicon-containing conductive layer; and
   a shielding structure covering a portion of the silicide layer, wherein the shielding structure comprises a top shielding layer covering a top surface of the silicide layer, and one portion of a sidewall of the silicide layer is covered by the dielectric layer and the other portion of the sidewall of the silicide layer is exposed.

2. The semiconductor device of claim 1, wherein a width of an upper portion of the silicide layer is less than a width of a lower portion of the silicide layer.

3. The semiconductor device of claim 1, wherein a material of the shielding structure comprises silicon oxide, silicon nitride, or a combination thereof.

4. A semiconductor device, comprising:
   a silicon-containing conductive layer;
   a dielectric layer located around the silicon-containing conductive layer;
   a silicide layer located on the silicon-containing conductive layer; and
   a shielding structure covering a portion of the silicide layer, wherein the shielding structure comprises a shielding spacer exposing a first sidewall and a top surface of the silicide layer and covering a second sidewall of the silicide layer, and the second sidewall is located over the first sidewall.

5. The semiconductor device of claim 4, wherein a width of an upper portion of the silicide layer is less than a width of a lower portion of the silicide layer.

6. The semiconductor device of claim 4, wherein a material of the shielding structure comprises silicon oxide, silicon nitride, or a combination thereof.

* * * * *